(12) United States Patent
Franson

(10) Patent No.: US 12,555,902 B2
(45) Date of Patent: Feb. 17, 2026

(54) ANTENNA APPARATUS EMPLOYING RADIATION SHIELD FOR INTEGRATED CIRCUITS

(71) Applicant: VIASAT, INC., Carlsbad, CA (US)

(72) Inventor: Steven J. Franson, Scottsdale, AZ (US)

(73) Assignee: VIASAT, INC., Carlsbad, CA (US)

( * ) Notice: Subject to any disclaimer, the term of this patent is extended or adjusted under 35 U.S.C. 154(b) by 0 days.

(21) Appl. No.: 18/721,696

(22) PCT Filed: Dec. 22, 2021

(86) PCT No.: PCT/US2021/064969
§ 371 (c)(1),
(2) Date: Jun. 19, 2024

(87) PCT Pub. No.: WO2023/121667
PCT Pub. Date: Jun. 29, 2023

(65) Prior Publication Data
US 2025/0062527 A1    Feb. 20, 2025

(51) Int. Cl.
*H01Q 1/52*    (2006.01)
*H01Q 1/22*    (2006.01)
(Continued)

(52) U.S. Cl.
CPC .......... *H01Q 1/526* (2013.01); *H01Q 1/2283* (2013.01); *H01Q 1/48* (2013.01); *H01Q 9/065* (2013.01)

(58) Field of Classification Search
None
See application file for complete search history.

(56) References Cited

U.S. PATENT DOCUMENTS

| 11,502,401 B2 * | 11/2022 | Sinha .................. H01Q 9/0421 |
| 2005/0088260 A1 | 4/2005 | Ajioka et al. |

(Continued)

FOREIGN PATENT DOCUMENTS

| JP | 1993-018113 A2 | 1/1993 |
| JP | 2005-086603 A2 | 3/2005 |

(Continued)

OTHER PUBLICATIONS

International Search Report and Written Opinion dated Aug. 16, 2022 in corresponding PCT Application No. PCT/US2021/064969 (12 pages).

*Primary Examiner* — Wilson Lee
(74) *Attorney, Agent, or Firm* — F. CHAU & ASSOCIATES, LLC

(57) ABSTRACT

An antenna apparatus includes a radiation shield between an antenna element and at least one radio frequency integrated circuit (RFIC) coupled to the antenna element. An antenna substrate includes a first dielectric layer having opposite first and second surfaces, and a first metallization layer attached to the second surface to form a ground plane. A base substrate includes at least one second dielectric layer having opposite third and fourth surfaces, and a second metallization layer having a first side attached to the third surface and a second side attached to the first metallization layer to form the radiation shield. The RFIC is RF coupled to the antenna element through at least one via extending through the base substrate and a coupling element within aligned openings of the first and second metallization layers.

36 Claims, 10 Drawing Sheets

(51) Int. Cl.
*H01Q 1/48* (2006.01)
*H01Q 9/06* (2006.01)

(56) References Cited

U.S. PATENT DOCUMENTS

| | | | |
|---|---|---|---|
| 2014/0145883 A1* | 5/2014 | Baks | H01L 23/66 |
| | | | 343/700 MS |
| 2014/0151860 A1 | 6/2014 | Nakamura et al. | |
| 2014/0357089 A1 | 12/2014 | Buckalew et al. | |
| 2017/0250120 A1* | 8/2017 | Harauchi | H01L 25/072 |
| 2020/0295453 A1* | 9/2020 | Kuo | H01L 23/3128 |
| 2022/0406722 A1* | 12/2022 | Chang | H01L 21/4857 |
| 2023/0083146 A1* | 3/2023 | We | H01Q 9/0414 |
| 2023/0187374 A1* | 6/2023 | Jian | H01L 21/561 |
| | | | 257/224 |
| 2023/0370536 A1* | 11/2023 | Yueh | H04M 1/026 |
| 2025/0233320 A1* | 7/2025 | Tian | H01Q 9/0407 |

FOREIGN PATENT DOCUMENTS

| | | |
|---|---|---|
| JP | 2012-039129 A2 | 2/2012 |
| KR | 10-2061620 B1 | 1/2020 |
| WO | WO2006138423 A2 | 12/2006 |
| WO | WO2013121732 A1 | 8/2013 |

\* cited by examiner

ANTENNA APPARATUS EMPLOYING RADIATION SHIELD FOR INTEGRATED CIRCUITS

CROSS REFERENCE TO RELATED APPLICATION

This application is a 371 National Stage entry of PCT application no. PCT/US2021/064969, filed on Dec. 22, 2021, of which the entire contents are incorporated by reference herein.

TECHNICAL FIELD

This disclosure relates generally to antennas and more particularly to an antenna apparatus with radiation shielding for radio frequency (RF) circuitry integrated with antenna elements.

DISCUSSION OF RELATED ART

In space, military and some industrial environments, antenna elements and RF circuitry coupled thereto may be exposed to radiation such as ionizing radiation, solar radiation, cosmic background radiation, wave radiation, particle radiation and/or electromagnetic radiation. The RF circuitry may be particularly vulnerable to the radiation in the absence of adequate shielding. For instance, a thin, generally planar structure for an antenna apparatus may have a sandwich type configuration including antenna elements disposed in an exterior facing component layer and integrated circuits (ICs) distributed across a parallel component layer behind the antenna element layer. The ICs may include RFICs with front end circuitry such as RF power amplifiers (PAs) for transmit operations, low noise amplifiers (LNAs) for receive operations, and phase shifters for beam steering. It is desirable for the RFICs to be close to the antenna elements for optimum performance. Other ICs may include circuitry providing biasing and control signals to the RFICs, or baseband/digital signal processing circuitry.

The antenna elements may be microstrip patch elements printed on an antenna substrate in which an antenna ground plane is printed on the opposite side. The antenna ground plane may provide some radiation resistance for the ICs. However, certain types of radiation at high intensity may still penetrate the ground plane and degrade the ICs, resulting in reduced reliability of the antenna system.

SUMMARY

In an aspect of the present disclosure, an antenna apparatus includes an antenna substrate and a base substrate. The antenna substrate includes a first dielectric layer having opposite first and second surfaces, and a first metallization layer adjacent the second surface to form a ground plane. At least one antenna element is attached to the first surface. The base substrate includes at least one second dielectric layer having opposite third and fourth surfaces, and a second metallization layer having a first side adjacent the third surface and an opposite, second side attached to the first metallization layer to form a radiation shield. The first and second metallization layers have respective first and second openings aligned with one another and underlying the antenna element. At least one RFIC is situated adjacent the fourth surface of the base substrate, and is RF coupled to the at least one antenna element through at least one via extending through the base substrate and a coupling element within the first and second openings.

In an embodiment, the first and second metallization layers are attached and electrically connected through an electrically conductive adherent therebetween. In an alternative embodiment, the first and second metallization layers are attached by a fill material layer having a thickness greater than a thickness of each of the first and second metallization layers.

In another aspect, a method of fabricating an antenna apparatus includes forming an antenna substrate that includes a first dielectric layer having opposite first and second surfaces, and a first metallization layer adjacent the second surface to form a ground plane for at least one antenna element. The first metallization layer is formed with a first opening. The at least one antenna element is attached to the first surface of the antenna substrate. A base substrate is formed, which includes: at least one second dielectric layer having opposite third and fourth surfaces; at least one via extending through the second dielectric layer; and a second metallization layer adjacent the third surface to form at least part of a radiation shield in conjunction with the first metallization layer. The second metallization layer has a second opening aligned with the first opening. At least one signal via having a first end within the second opening is formed extending through the second dielectric layer. The antenna substrate is attached to the base substrate by at least connecting a coupling element within the first and second openings between the signal via and the antenna substrate. The first metallization layer is attached to the second metallization layer, and at least one RFIC is attached to the fourth surface of the base substrate and electrically connected to the at least one signal via.

BRIEF DESCRIPTION OF THE DRAWINGS

The above and other aspects and features of the disclosed technology will become more apparent from the following detailed description, taken in conjunction with the accompanying drawings in which like reference characters indicate like elements or features. Various elements of the same or similar type may be distinguished by annexing the reference label with an underscore/dash and second label that distinguishes among the same/similar elements (e.g., _1, _2), or directly annexing the reference label with a second label. However, if a given description uses only the first reference label, it is applicable to any one of the same/similar elements having the same first reference label irrespective of the second label. Elements and features may not be drawn to scale in the drawings.

DETAILED DESCRIPTION OF EMBODIMENTS

The following description, with reference to the accompanying drawings, is provided to assist in a comprehensive understanding of certain exemplary embodiments of the technology disclosed herein for illustrative purposes. The description includes various specific details to assist a person of ordinary skill the art with understanding the technology, but these details are to be regarded as merely illustrative. For the purposes of simplicity and clarity, descriptions of well-known functions and constructions may be omitted when their inclusion may obscure appreciation of the technology by a person of ordinary skill in the art.

Figure 1:
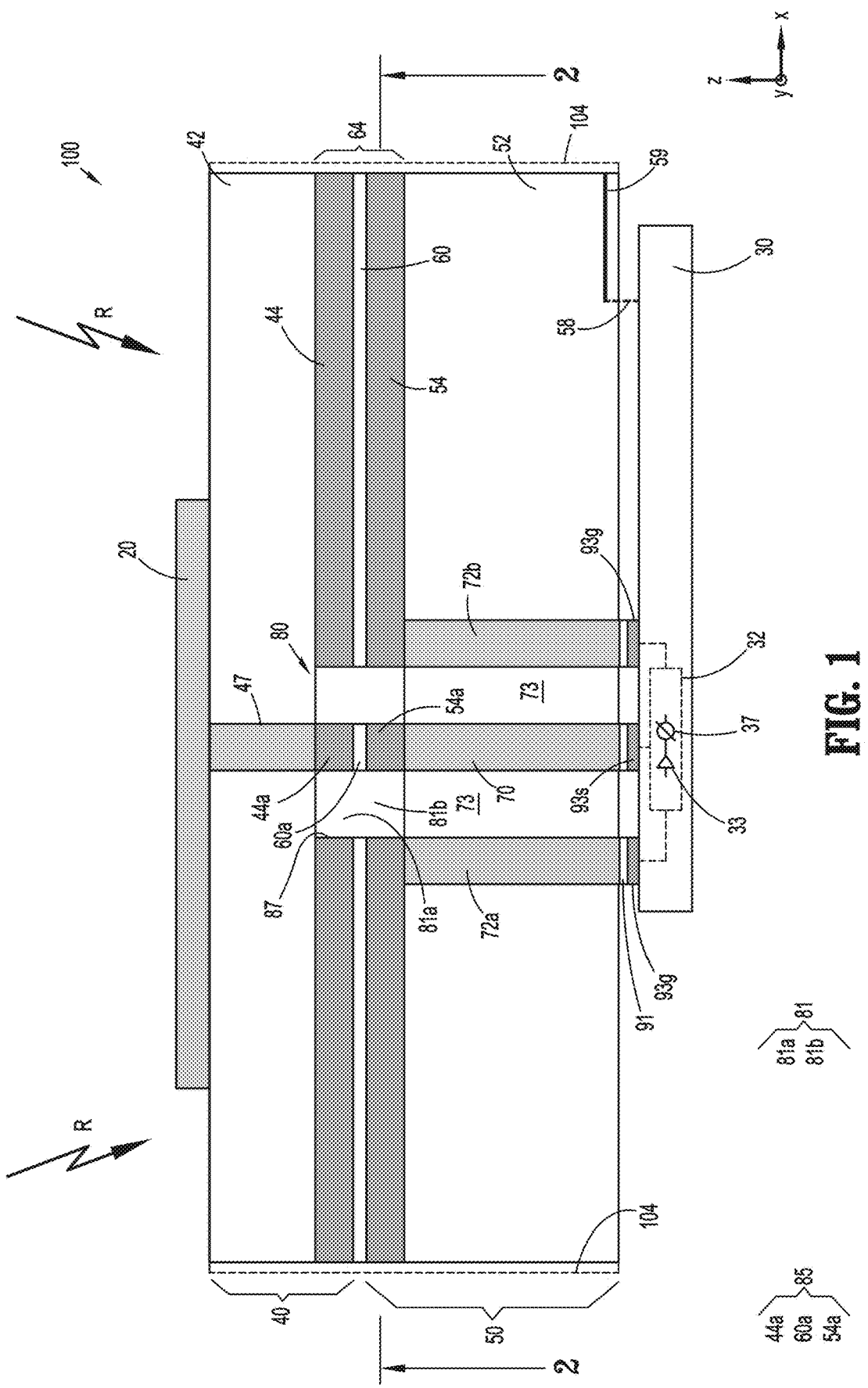
FIG. 1 is a cross-sectional view of an antenna apparatus according to an embodiment, illustrating a first example inter-layer structure for radiation shielding of ICs of the antenna apparatus.

FIG. 1 is a cross-sectional view of an antenna apparatus, 100, according to an embodiment. Antenna apparatus 100 may include an antenna substrate 40, a base substrate 50, an antenna element 20 and an RFIC chip or wafer 30, (hereafter just "RFIC 30"), e.g., a monolithic microwave IC (MMIC). Although one antenna element 20 and one RFIC 30 are depicted, in various embodiments antenna apparatus 100 is configured as an active antenna array, e.g., a phased array, in which a plurality of antenna elements 20 are arranged across the upper surface of antenna substrate 40 (in the x-y plane of FIG. 1) and a plurality of RFICs 30 are arranged across the lower surface of base substrate 50. (Herein, "upper" and "lower" are used as relative terms for ease of description and understanding. The upper surface of antenna substrate 40 is the outer surface interfacing with free space.) Each RFIC 30 is RF coupled to at least one antenna element 20 through coupling structures within base substrate 50 and antenna substrate 40. In a typical embodiment, antenna apparatus 100 has a thin, plate-like profile in which the maximum thickness (in the z direction) is at least one order of magnitude smaller than the maximum orthogonal direction (in the x-y plane).

Antenna substrate 40 may include a first dielectric layer 42 to which antenna element 20 is attached, and a first metallization layer 44 adjacent a lower surface of dielectric layer 42. First metallization layer 44 forms a ground plane for antenna element 20 and may hereafter be referred to interchangeably as "ground plane 44". Base substrate 50 may include a second dielectric layer 52 with upper and lower surfaces, and a second metallization layer 54 adjacent the upper surface. RFIC 30 is adjacent the lower surface of second dielectric layer 52. In some examples, dielectric layers 42 and 52 are composed of glass (e.g., fused silica) or quartz.

First metallization layer 44 may be attached to second metallization layer 54 by an electrically conductive adherent 60. Collectively, first metallization layer 44, adherent 60, and second metallization layer 54 form a radiation shield 64 that protects RFIC 30 from radiation R penetrating the upper surface of first dielectric layer 42. Such radiation R may be in the form of ionizing radiation, wave radiation, particle radiation, solar radiation, cosmic background radiation and/or electromagnetic radiation. The thickness and composition of first and second metallization layers 44 and 54 are designed to reduce the levels of harmful radiation penetrating second dielectric layer 52 towards RFIC 30.

In one example, metallization layers 44 and 54 are each formed by a metal pillar (or metal "bump") formation process, e.g., a copper pillar, gold pillar or a platinum pillar formation process. Adherent 60 may be a solder cap layer and is typically thinner than each of metallization layers 44 and 54. In one embodiment, metallization layers 44 and 54 are each at least 50 μm thick (thickness is in the z direction of FIG. 1). In another embodiment, each of layers 44 and 54 is at least 100 μm thick. For instance, in space applications, it is desirable to protect against total ionizing dose (TID), which is caused by radiation-induced charge generation/trapping. Shielding sufficient to protect against this type of radiation may be provided when metallization layers 44 and 54 are each composed of a thick, dense material, e.g., a pure metal such as copper, tantalum or platinum, or a metal alloy. One way to design a suitable thickness for a given material is to consider the requisite lifetime of antenna apparatus 100 in its operational environment. When mounted on an orbiting satellite, a radiation dose depth curve that correlates a thickness in a given material needed to attenuate radiation levels down to a certain amount per year may be consulted. A specification for an expected or minimum lifetime of RFIC 30 in a given radiation environment may also be considered. With such information, thicknesses for metallization layers 44 and 54, as well as the thickness and composition of dielectric layer 52 of base layer 50, may be designed.

As an example, for a conventional antenna apparatus that does not utilize attached metallization layers 44 and 54, MMICs behind antenna substrate 40 (e.g., attached directly to the lower surface of antenna substrate 40) may receive about 500 krad/year of radiation. With antenna apparatus 100 embodied with radiation shield 64 having a thickness that includes 100 μm of copper, and with dielectric layer 52 composed of fused silica, RFIC 30 may receive about 150 krad/year of radiation. With the thickness of radiation shield 64 increased to include 200 μm of copper, RFIC 30 may receive about 75 krad/year of radiation. Thus, total incident radiation over time is significantly reduced in these examples, thereby increasing the lifetime of RFIC 30. In other examples, when copper within metallization layers 44 and 54 is substituted with a denser material such as tantalum or platinum of the same thickness, the radiation incident upon RFIC 30 is reduced even further. Note that fused silica is one example of a material that also provides considerable shielding against radiation. Thus, dielectric layer 52 of base substrate 50, when composed of fused silica or a similar material, provides a portion of the radiation shielding. For instance, 250 μm of fused silica is equivalent in density to approximately 60 μm of copper and may provide about the same attenuation in radiation.

In general, the thicknesses of metallization layers 44 and 54 may be at least one order of magnitude greater than the thickness of antenna element 20 (which thickness is shown exaggerated relative to layers 44 and 54 in FIG. 1). Antenna element 20 may be a printed element formed by a thin film process in a typical embodiment. Antenna apparatus 100 may also include peripheral shielding 104 (depicted schematically in FIG. 1) surrounding the overall structure, to reduce radiation incident from peripheral directions. Peripheral shielding 104 may be in the form of a continuous metal housing.

First metallization layer 44 may have an opening 81a aligned with an opening 81b within second metallization layer 54, where openings 81a and 81b underly antenna element 20. A coupling element 85 may be centrally formed within a coaxial structure in the region of openings 81a and 81b. Coupling element 85 may include an upper metal pillar 44a, a lower metal pillar 54a and a conductive adherent 60a conductively attaching metal pillars 44a and 54a. Metal pillars 44a and 54a may be portions of metal pillar layers 44 and 54, respectively, and formed as part of the same process that formed respective layers 44 and 54. Conductive adherent 60a may be a portion of adherent 60.

Coupling element 85 may be understood as an inner conductor of a short coaxial transmission line ("coaxial line") 80, discussed further below. A "signal via" 70 may extend vertically through base substrate 52 and electrically connect on a lower end thereof to a "signal contact" 93s of RFIC 30 through a conductive joint 91, e.g., a solder cap. A probe feed 47 may be a via formed through first dielectric layer 42, and may have a lower end connected to an upper end of metal pillar 44a and an upper end connected to antenna element 20. Thus, RFIC 30 may be RF coupled to antenna element 20 through via 70, coupling element 85, and probe feed 47. In other embodiments, probe feed 47 is omitted or only partially penetrates dielectric layer 42 from the lower surface of dielectric layer 42. In this case, coupling element 85 is electromagnetically (EM) coupled to antenna element 20 (i.e., antenna element 20 is EM excited through via 70 and coupling element 85).

It is noted here that instead of providing coaxial line 80 formed with a metal pillar process on opposite ends and attaching the ends with conductive epoxy 60a, a pre-formed coaxial coupling structure in the form of an insertable coaxial line section may be substituted. This approach is discussed in connection with FIG. 8 below. The insertable section may having opposite ends that are suitably attached to dielectric layers 42 and 52.

One or more ground contacts 93g of RFIC 30 may be coupled to second metallization layer 54 and ground plane 44 (through adherent 60). Such coupling is made through one or more "ground vias" 72a and/or 72b extending through second dielectric layer 52 on one or more sides of signal via 70. In embodiments where two or more ground vias 72a and 72b are included, a "ground-signal-ground (GSG)" transition or "GSG connection" between RFIC 30 and ground plane 44 includes ground vias 72a and 72b and signal via 70. If only a single ground via is included in other embodiments, the connection between RFIC 30 and ground plane 44 may be described as a "ground-signal (GS) transition" or "GS connection", which includes one ground via 72a or 72b and signal via 70.

Figure 2:
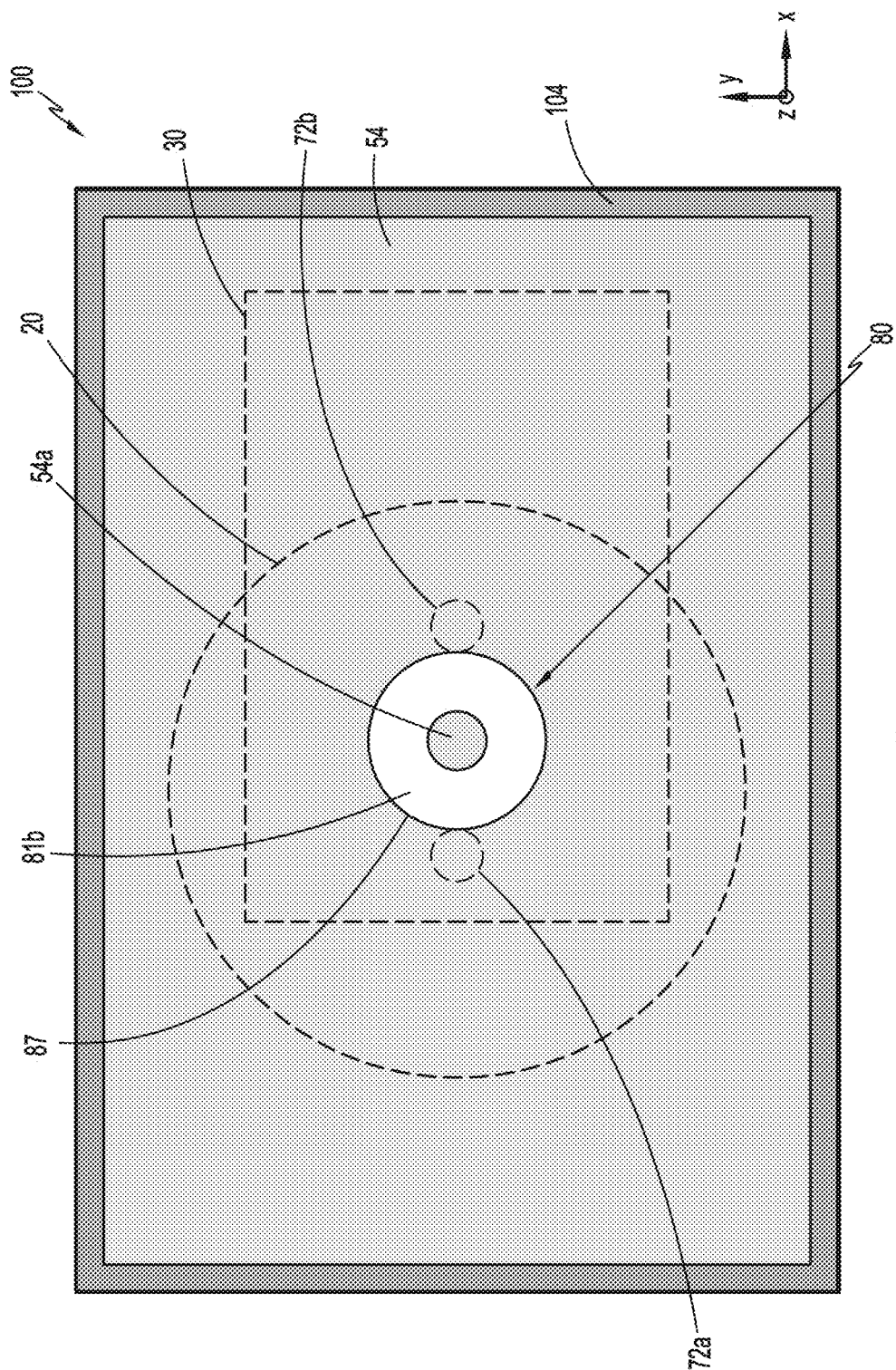
FIG. 2 is a cross-sectional view of the antenna apparatus of FIG. 1 taken along the lines 2-2.

FIG. 2 is a cross-sectional view of antenna apparatus 100 taken along the lines 2-2 of FIG. 1. In FIG. 2, example profiles of antenna element 20, RFIC chip 30, and first and second ground vias 72a and 72b are shown in phantom. Referring collectively to FIGS. 1 and 2, an annular isolation region 81 concentrically surrounds coupling element 85 and extends to a circumferential edge 87 of first and second metallization layers 44 and 54. Circumferential edge 87 defines openings 81a and 81b in first and second metallization layers 44 and 54. Isolation region 81 may be an air-filled region or may be filled with dielectric material. Isolation region 81 may be understood as a space encompassing outer annular portions of openings 81a and 81b (the portions excluding coupling element 85) and the vertical space therebetween (with thickness of adherent 60). Coupling element 85, in conjunction with isolation region 81 and circumferential edges 87 of metallization layers 44 and 54, forms coaxial line 80, where coupling element 85 is the inner conductor, circumferential edge 87 is the outer conductor, and isolation region 81 is a dielectric spacer or air-filled spacer of the coaxial line 80. It is noted there that although radiation R may penetrate isolation region 81, the diameter of region 81 is small compared to the dimensions of antenna apparatus 100 in the x-y plane and therefore the penetrating radiation may have negligible impact on RFIC 30 and any other circuitry below base substrate 50.

The above-noted GSG transition between RFIC 30 and ground plane 44 may be understood as a GSG transition between RFIC 30 and coaxial line 80. Isolation region 81 of coaxial line 80 may be vertically aligned with an annular isolation region 73 between signal via 70 and ground vias 72a and 72b. Thus, RF signal energy may flow through an RF feed encompassing the GSG transition, the coaxial coupling structure, and an antenna feed within dielectric substrate 42 (the probe feed 47 or an EM coupled antenna feed). In other words, signal energy flows from RFIC 30 through isolation region 73 and isolation region 81 and dielectric layer 42 to excite antenna element 20. It is noted that additional ground vias (not shown) may be situated at other circumferential locations outside and adjacent to edge 87 (as viewed from a distant point along the z axis) to reduce signal leakage/noise.

Antenna element 20 may be a microstrip patch antenna element with a circular profile, and may be offset fed by probe feed 47 as depicted in FIG. 2. In other examples, antenna element 20 is rectangular, square, or has another polygonal shape; or is oblong or irregularly shaped; or is a dipole or other type of antenna element. The patch antenna element may have been formed by a thin film process and may have a thickness in the range of 1-5 µm. RFIC 30 and its contacts 93 are desirably located directly below antenna element 20 to provide a short overall connection between RFIC 309 and antenna element 20. RFIC 30 includes at least one RF front end circuit path 32 (hereafter, "RF circuit 32"). RF circuit 32 includes at least one RF front end circuit component such as an amplifier 33, a phase shifter 37, active or passive filters, a transmit/receive (T/R) switch, impedance matching circuitry, an attenuator, an isolator, and so forth. RFIC 30 may include other circuitry such as a combiner/divider, an upconverter, a downconverter, etc.

The type and configuration of antenna element 20, its spacing from ground plane 44, and polarization may depend on a desired frequency band of operation. Similar design considerations are applicable to the circuitry of RFIC 30 and RF circuit 32. In a typical embodiment, antenna apparatus 100 is configured for operation in a microwave or millimeter (mm) wave band, microwave frequencies are generally considered 300 MHz to 30 GHz and mm wave frequencies are generally considered 30 GHz to 300 GHz. However, the technology herein may also be applied to antennas designed for sub-microwave frequencies, e.g., UHF or VHF bands.

Antenna apparatus 100 may be configured as a transmitting antenna system, a receiving antenna system, or both a transmitting and receiving antenna system. In an active array embodiment, each RF circuit 32 includes an amplifier 33 and/or phase shifter 37 to adjust a transmit signal and/or a receive signal provided to/from an antenna element 20. Multiple RFICs 30 may be distributed behind the effective aperture of antenna 100, each coupled to one or more antenna elements 20, and in this case antenna 100 may be understood as an active antenna array. In embodiments where the RF circuits 32 include phase shifters for dynamic phase shifting of the signals, antenna 100 functions as a phased array. In such a phased array embodiment, a beam formed by antenna 100 is steered to a desired beam pointing angle set mainly according to the phase shifts of the phase shifters. Additional amplitude adjustment capability within RFICs 30 may also be included to adjust the antenna pattern.

RFIC chip 30 may receive biasing voltages and control signals for controlling amplification, phase shifting, T/R switching, etc., by any suitable connection arrangement. For example, one or more control IC chips (not shown) may be attached to the lower surface of dielectric layer 52 and electrically coupled to RFIC 30 to provide the biasing/control signals. The biasing/control signals may be routed through signal lines 59 formed by a patterned metallization layer within a lower portion of dielectric layer 52 (or formed within additional thin dielectric layers at the lower surface of dielectric layer 52) and connected to RFIC chip 30 through interconnects 58 (shown schematically). These control IC chips may be likewise protected from incident radiation R by the radiation shielding of metallization layers 44 and 54. When a plurality of RFICs 30 are distributed across the lower surface of dielectric layer 52, they may each be coupled to a combiner/divider network (not shown) for combining signals received by antenna elements 20 to form a receive beam and/or dividing signals to be transmitted through antenna elements 20 to form a transmit beam. The combiner/divider network may be arranged within a transmission line substrate(s) located between or below RFICs 30, or it may be formed by a patterned metal layer within dielectric layer 52.

Figure 3:
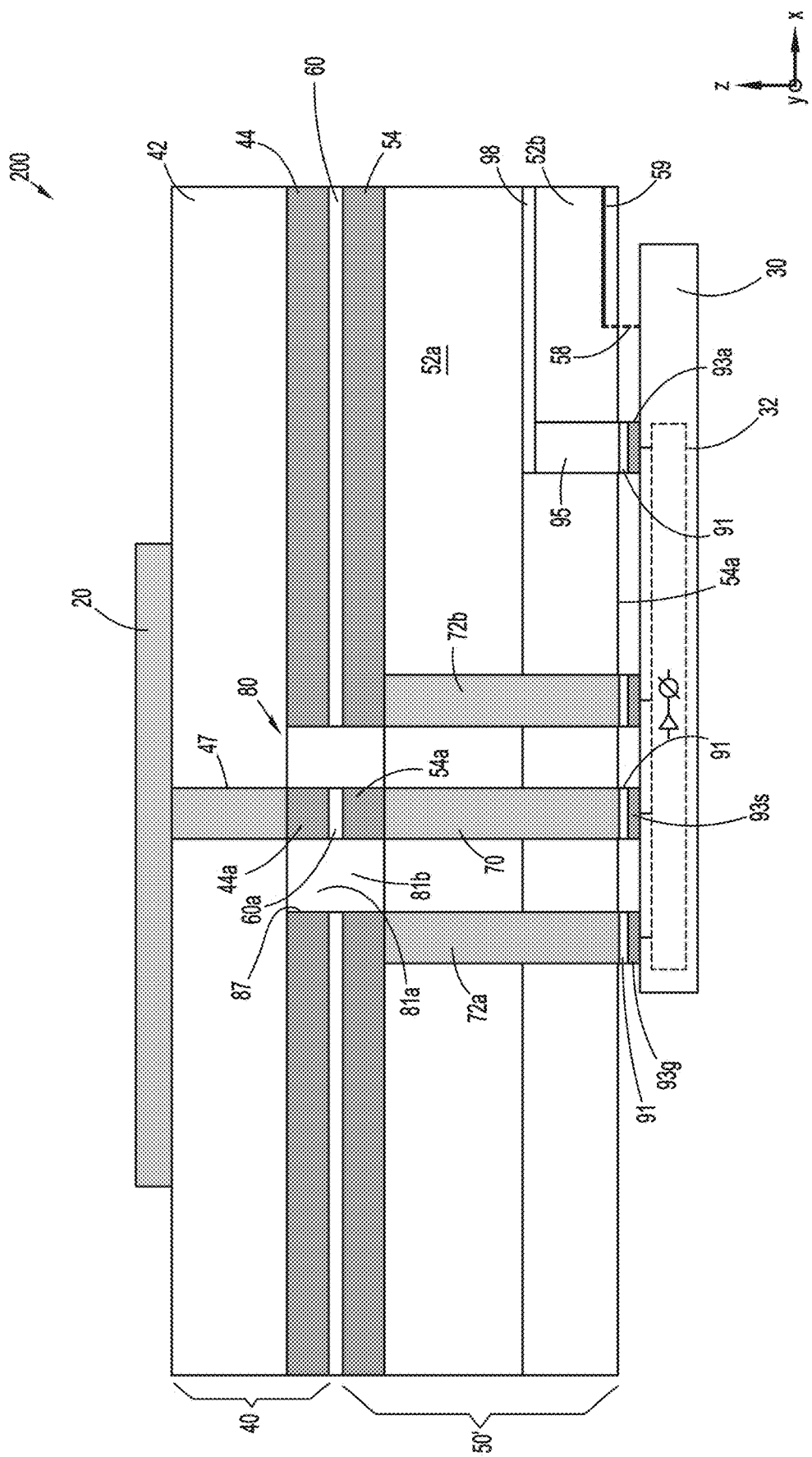
FIG. 3 is a cross-sectional view of an antenna apparatus having a multi-layer base substrate according to an embodiment.

FIG. 3 is a cross-sectional view of an antenna apparatus, 200, having a multi-layer base substrate according to an embodiment. Antenna apparatus 200 may have the same configuration and functionality as antenna apparatus 100 described above, but with base substrate 50' including multiple dielectric layers 52a and 52b and a patterned metallization layer 98 therebetween. Metallization layer 98 may be coupled to RFIC 30 through one or more blind vias 95 and one or more contacts 93a of RFIC 30. Metallization layer 98 may be patterned to form part of a combiner/divider network to route RF signals to/from RFICs 30. Metallization layer 98 may alternatively or additionally be coupled to one or more control IC chips (not shown) that may be attached to the lower surface of dielectric layer 52b and provide bias/control signals.

Figure 4:
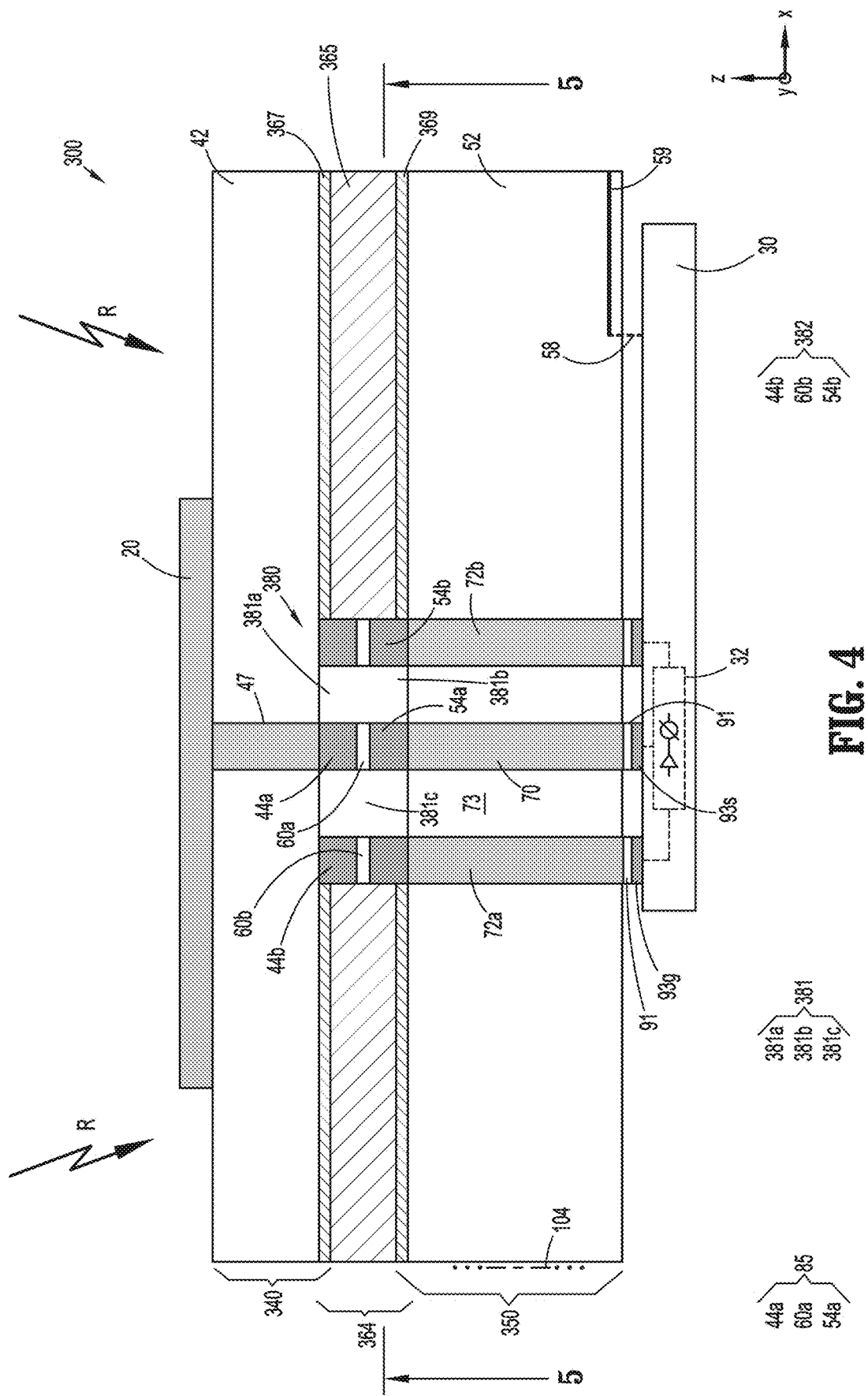
FIG. 4 is a cross-sectional view of an antenna apparatus that includes filler material forming a portion of a radiation shield, according to an embodiment.
Figure 5:
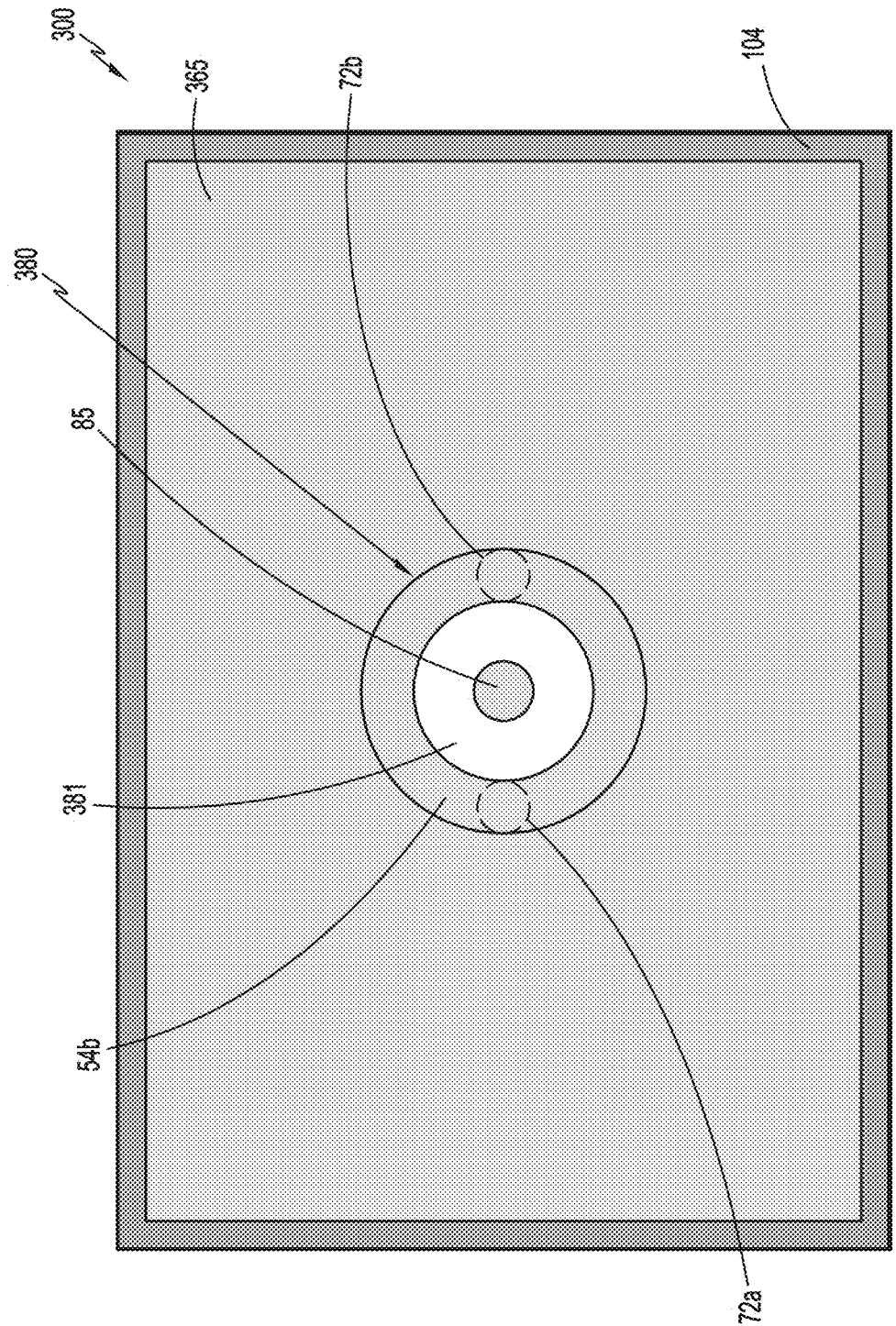
FIG. 5 is a cross-sectional view of the antenna apparatus of FIG. 4 taken along the lines 5-5.

FIG. 4 is a cross-sectional view of an antenna apparatus, 300, according to another embodiment. Antenna apparatus 300 includes a filler material layer 365 for improving manufacturing yield and structural integrity over a range of environmental conditions. FIG. 5 is a cross-sectional view of antenna apparatus 300 taken along the lines 5-5 of FIG. 4. Referring to FIGS. 4 and 5, antenna apparatus 300 may include an antenna substrate 340, a base substrate 350, filler material layer 365, at least one antenna element 20, at least one RFIC chip 30 (or wafer) including RFIC 32, and a coaxial coupling structure 380 (e.g., a short coaxial line) including a coupling element 85. Description of elements with the same legends as those described above may be omitted to avoid redundancy.

Antenna substrate 340 may include first dielectric layer 42 and a first metallization layer 367 adjacent a lower surface of dielectric layer 42, where first metallization layer 367 functions as a ground plane for antenna element 20. First metallization layer 367 may be thinner than first metallization layer 44 of FIG. 1 and may have been formed on the lower surface of dielectric layer 42 by a thin film deposition process or the like. Base substrate 350 may include second dielectric layer 52 and a second metallization layer 369. Second metallization layer 369 may be thinner than second metallization layer 54 of FIG. 1 and may have been formed on the upper surface of dielectric layer 52 by a similar process as for first metallization layer 367. Filler material layer 365 may be composed of a compliant material inserted between metallization layers 367 and 369 to completely fill the space around coaxial coupling structure 380 after coaxial coupling structure 380 was integrated with antenna substrate 340 and base substrate 350. Thus, first and second metallization layers 367 and 369 may be attached to one another by filler material layer 365.

Collectively, first and second metallization layers 367 and 369 and filler material layer 365 form a radiation shield 364 to reduce the impact of incident radiation R on RFIC 30 and any other circuitry below base substrate 350. Filler material layer 365 may be a compliant material layer that reduces the possibility of dielectric layers 42 and/or 52 cracking during manufacturing. Thereby, filler material layer 365 may improve manufacturing yield relative to antenna apparatus 100. For instance, in the absence of filler material 365, thick metal between dielectric layers 42 and 52 may expand and contract at a higher rate than dielectric layers 42 and 52 due to a coefficient of thermal expansion (CTE) mismatch between the metal and dielectric materials. The CTE mismatch may cause cracking when the antenna apparatus is subjected to high temperatures. By contrast, filler material layer 365 may have a CTE closer to those of dielectric layers 42 and 52 and prevent such cracking. Some examples of filler material layer 365 composition include: conductive epoxy; a mixture of tantalum and conductive epoxy; microwave absorber material; and underfill material. The selection of the material of filler material layer 365 and its thickness may be made in consideration of the amount of desired radiation attenuation, as discussed earlier in connection with metallization layers 44 and 54. For instance, a radiation dose depth curve that correlates a thickness in the material of filler material layer 365 needed to attenuate radiation levels down to a certain amount per year may be consulted. Due to its compliancy, filler material layer 365 may also prevent cracking in the region surrounding coaxial coupling structure 380 even if thick metal is used for coupling element 85 and a surrounding outer conductor 382 (in the form of a hollow tube or a ring) that interfaces with filler material layer 365.

Vertically aligned openings 381a and 381b may have been formed in first and second metallization layers 367 and 369, respectively. Coaxial coupling structure 380, which has portions within and between openings 381a and 381b, may include coupling element 85, outer conductor 382, and an annular isolation region 381. As described earlier, coupling element 85 may include upper metal pillar 44a, lower metal pillar 54a and conductive adherent 60a conductively attaching metal pillars 44a and 54a.

Outer conductor 382 may be the same thickness (in the z direction) as coupling element 85 and formed concurrently with coupling element 85 using the same processing operations. To this end, outer conductor 382 may include an upper ring portion 44b formed with a metal pillar build-up process on the surface of dielectric layer 42 opposite antenna element 20; a lower ring portion 54b formed with a metal pillar build-up process on the upper surface of dielectric layer 52; and a conductive adherent layer 60b attaching upper and lower ring portions 44b and 54b. With this construction, coaxial coupling structure 380 may be formed as a short coaxial line section with coupling element 85 as the inner conductor; outer conductor 382; and isolation region 381 separating the inner and outer conductors. Isolation region 381 may include portions of openings 381a and 381b and a volumetric region 381c therebetween. Isolation region 381 may be filled with a low loss dielectric material and may be vertically aligned with annular isolation region 73 between signal via 70 and ground vias 72a and 72b. In another example discussed below in connection with FIG. 8, instead of building up coaxial coupling structure 380 with a metal pillar process on opposite ends and attaching the ends with conductive epoxy 60a, a coaxial coupling structure is in the form of an insertable coaxial plug having opposite ends that are attached to dielectric layers 42 and 52.

The upper end of outer conductor 382 is coupled to first metallization layer 367, and the lower end of outer conductor 382 is coupled to each of second metallization layer 369 and ground vias 72a and 72b. (Ground vias 72a and 72b are shown in phantom in FIG. 5.) The coupling to first and second metallization layers 367 and 369 may be made in any suitable manner. For instance, although shown adjacent to layers 367 and 369 in FIG. 4, portions of first and second metallization layers 367 and 369 may be present above and below outer conductor 382, and the ring portions 44b and 54b may have been built up with a metal pillar process on these portions of layers 367 and 369. It is noted here that under bump metallization (UBM) may be present between upper ring portion 44b and dielectric layer 42 and between lower ring portion 54b and dielectric layer 52 to further reduce the possibility of stress cracks above and below the region of coaxial structure 380. Likewise, UBM may be present between the upper and lower ends of coupling element 85 and the adjacent dielectric layers.

Other components of antenna apparatus 300, such as RF circuit(s) 32, RFIC(s) 30, antenna element(s) 20, probe feed 47, etc., may be the same as that described herein for antenna apparatus 100. Dielectric layer 52 may be substituted with multi-layer dielectric such as that shown in FIG. 3 (comprising layers 52a, 52b) to route RF signals to/from RFIC 30.

Figure 6:
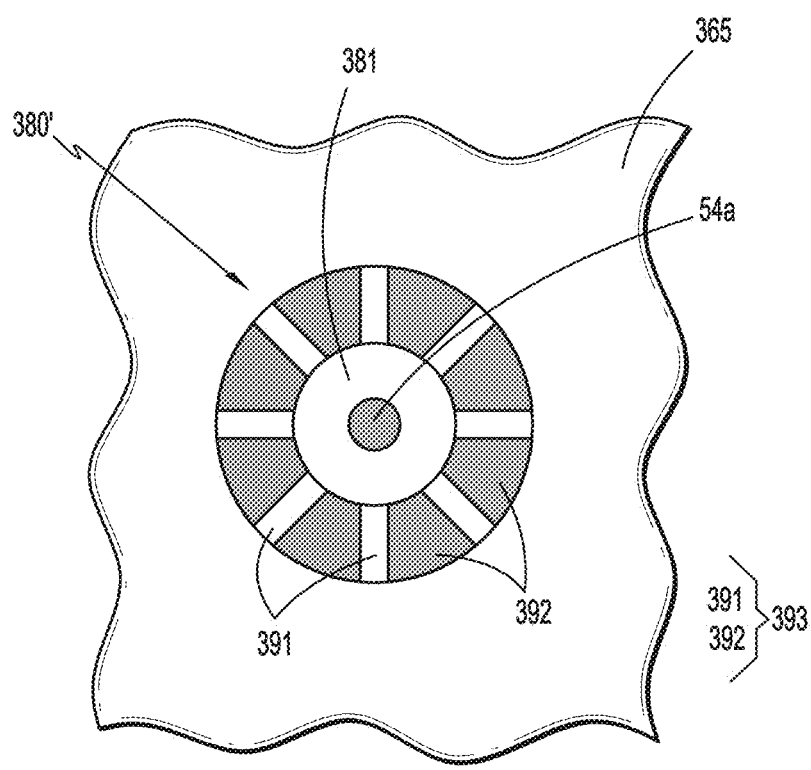
FIG. 6 is a cross-sectional view of an alternative coaxial structure incorporating a coupling element within the antenna apparatus of FIG. 4.

FIG. 6 is a cross-sectional view showing an alternative coaxial coupling structure, 380', that may be substituted for coaxial structure 380 within antenna apparatus 300. (FIG. 6 is view of coaxial coupling structure 380' taken along the lines 5-5 of FIG. 4.) This embodiment may further reduce the occurrence of cracking in the region within and proximate to the coaxial coupling structure.

Coaxial coupling structure 380' differs from coupling structure 380 by substituting a slotted outer conductor 393 for outer conductor 382. The height of coaxial structure 380' (in the z direction) may be the same as that for coaxial structure 380. Outer conductor 393 has the general form of a slotted hollow tube, with a plurality of slots 391 alternating circumferentially with conductive wall sections 392. Wall sections 392 may have each been formed between dielectric layers 42 and 52 using the same metal pillar formation process as that used for inner conductor 85. Thus, each wall section 392 may have upper and lower metal pillar formed sections attached together by a conductive adhesive layer portion therebetween (akin to layer portion 60a). Upper and lower surfaces of each wall section 392 may be electrically connected to first and second metallization layers 367 and 369, respectively. Isolation region 381 is desirably filled with low loss dielectric material. In one example, slots 391 are filled with the same dielectric material as that within isolation region 381. This may be done prior to the insertion of the filler material of filler material layer 365 in a liquid form in spaces surrounding outer conductor 393. In another example, slots 391 are filled with the filler material of filler material layer 365. Either approach may result in less cracks occurring during manufacturing of antenna apparatus 300. This is because outer conductor 393 may be more compliant and have a better CTE match with surrounding structures than outer conductor 383, which is composed of continuous metal throughout.

Figure 7:
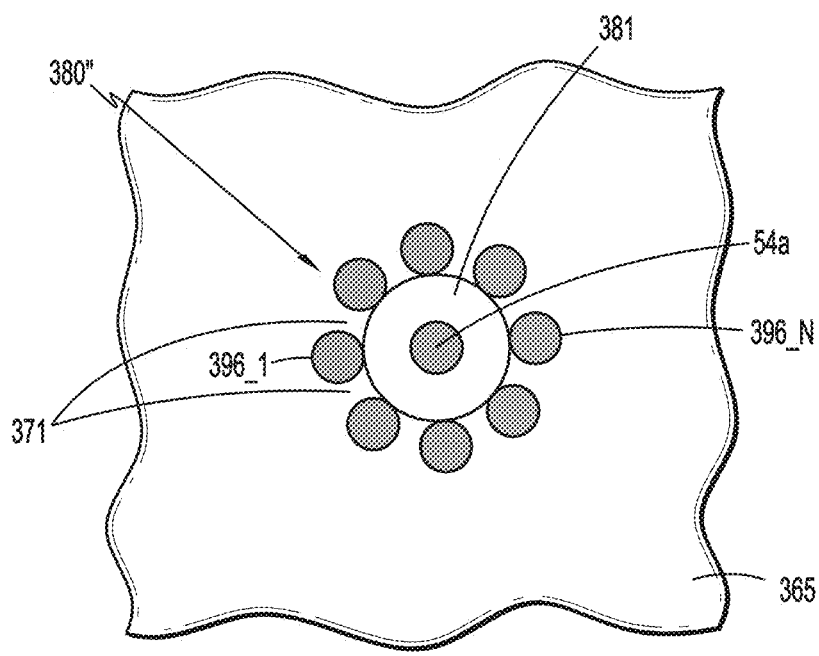
FIG. 7 is a cross-sectional view of another alternative coaxial structure incorporating a coupling element within the antenna apparatus of FIG. 4.

FIG. 7 is a cross-sectional view of another alternative coaxial coupling structure, 380'', that may be substituted for coaxial coupling structure 380 within antenna apparatus 300 (FIG. 7 is a view of coaxial coupling structure 380'' taken along the lines 5-5 of FIG. 4). This embodiment, similar to that of coupling structure 380', may reduce the occurrence of cracking as compared to embodiments with coaxial coupling structure 380.

Coaxial coupling structure 380' includes a plurality N of cylindrical ground rods 396_1 to 396_N as a substitute for the continuous outer conductor 382 of coupling structure 380. In the example of FIG. 7, N=8, but in other examples, N is more than eight or as few as two. The length of coaxial structure 380' (in the z direction) may be the same as that for coaxial structure 380. Rods 396 may be uniformly spaced circumferentially just outside the perimeter of isolation region 381. The rods 396 may have each been formed between dielectric layers 42 and 52 using the same metal pillar formation process as that used for inner conductor 85. Thus, each rod 396 may have upper and lower metal pillar formed sections attached together by a conductive adhesive layer portion therebetween (akin to layer portion 60a). Upper and lower surfaces of each rod 396 may be electrically connected to first and second metallization layers 367 and 369, respectively. Isolation region 381 is desirably filled with low loss dielectric material. Spaces 371 between adjacent rods 396 may be filled with the filler material of filler material layer 365. This approach may result in less cracks occurring during manufacturing of antenna apparatus 300, in that the interspersed structure of rods 396_1 to 396_N with compliant filler material therebetween may be more compliant and have a better CTE match with surrounding structures than outer conductor 383.

In the minimal case in which N=2, rod 396_1 is opposite rod 396_2, forming a GSG connection that extends from the lower GSG connection formed by ground vias 72a and 72b and signal via 70. In still another example, coaxial coupling structure 380 is substituted with a GS connection including coupling element 85 and only one rod 396.

Figure 8:
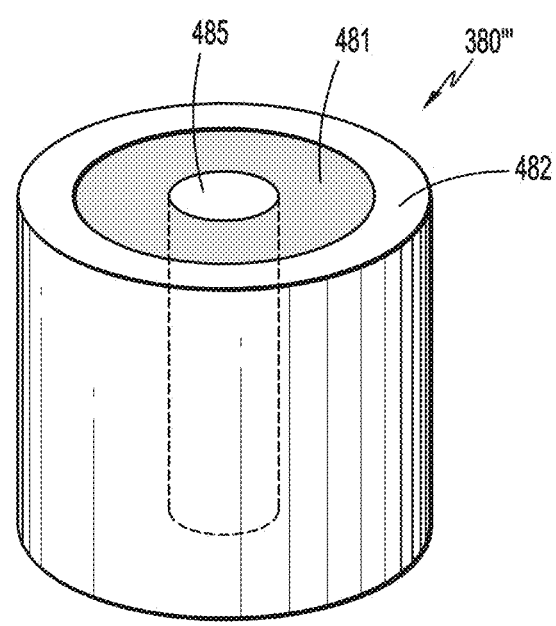
FIG. 8 is a perspective view of a further alternative coaxial structure incorporating a coupling element within the antenna apparatus of FIG. 4.

FIG. 8 is a perspective view illustrating a coaxial line section, 380'', which is an alternative to coaxial coupling element 380 of antenna apparatus 300. Coaxial line section 380'' may have an inner conductor 485 constructed of a continuous metal such as copper, an outer conductor 482 constructed of continuous metal, and a dielectric spacer region 481 therebetween. When integrated within antenna apparatus 300 (prior to the formation of filler material layer 365), upper and lower surfaces of inner conductor 485 may be electrically connected to probe feed 47 and signal via 70, respectively. An upper surface of outer conductor 482 may be connected to first metallization layer 367. A lower surface of outer conductor 482 may be connected to each of second metallization layer 369 and ground via 72a and/or 72b. Dielectric filler layer 365 may surround outer conductor 482 in the same manner as it does for coaxial coupling structure 380.

Figure 9:
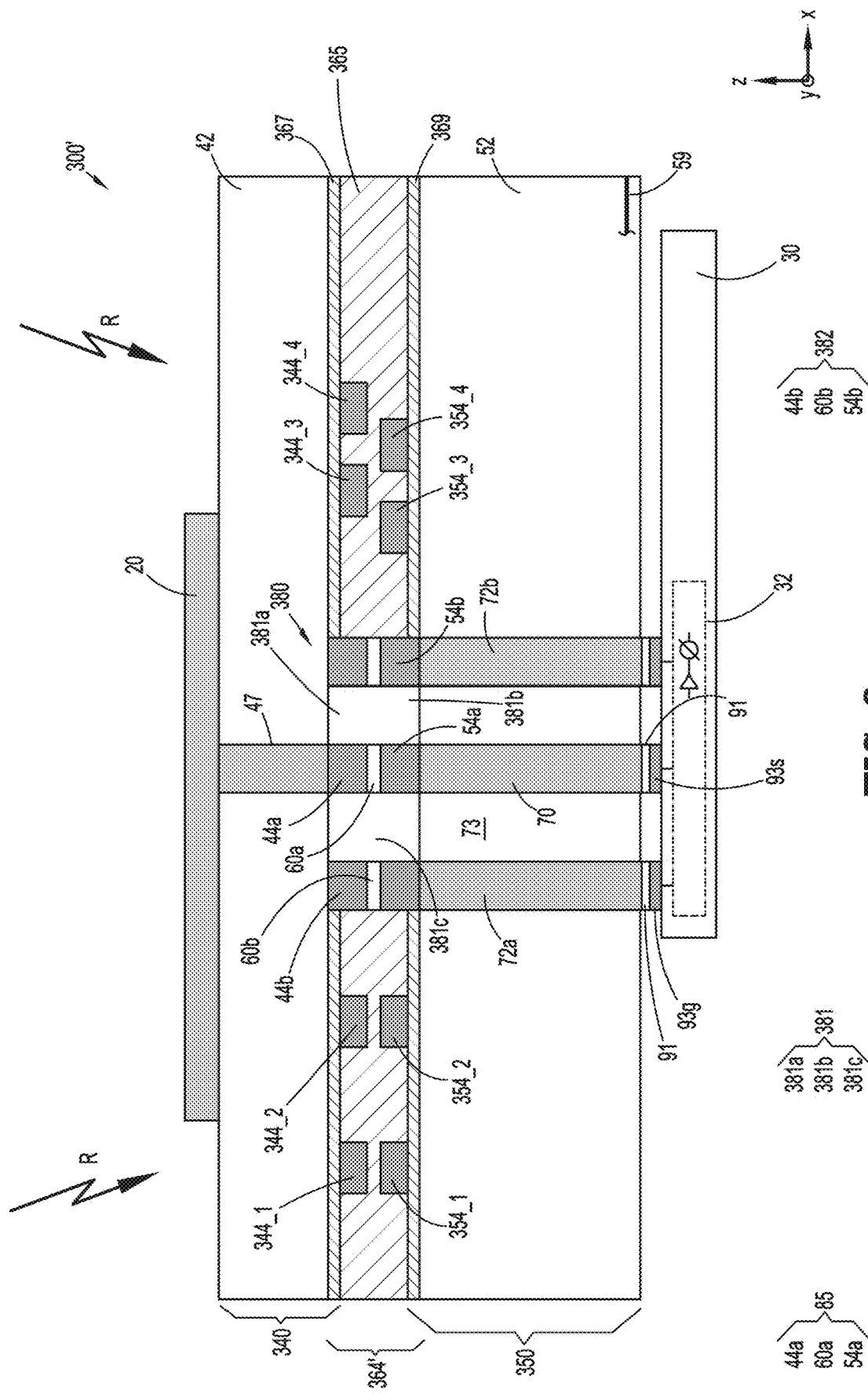
FIG. 9 is a cross-sectional view of an antenna apparatus including filler material and additional shielding structures, forming a portion of a radiation shield according to an embodiment.

FIG. 9 is a cross-sectional view of an antenna apparatus, 300', including filler material with additional shielding structures according to an embodiment. Antenna apparatus 300' differs from antenna apparatus 300 by including a plurality of metal pillars such as 344 and 354 formed on first and second metallization layers 367 and 369, respectively. Metal pillars 344 and 354 may be surrounded by the filler material of layer 365, and may provide additional radiation shielding from radiation R for circuitry below base substrate 350. Thus, a modified radiation shield 364' may include first and second metallization layers 367 and 369, filler material layer 365, and metal pillars 344 and/or 354. Metal pillars 344 and 354 may have similar dimensions as metal pillars 44a and 54a. In some examples, such as illustrated in FIG. 9, metal pillars 344 are not electrically adhered to any vertically aligned metal pillars 354 with a conductive adherent such as 60a. In other examples, vertically aligned metal pillars, such as 344_1 and 354_1, are electrically adhered.

In some examples, metal pillars are uniformly arranged in the x-y plane and vertically aligned (in the z direction). For instance, metal pillars such as 344_1 and 344_2 are vertically aligned with metal pillars 354_1 and 354_2 are may each be part of a uniform metal pillar grid distributed across metallization layers 367 and 369, respectively, in the x-y plane. In other examples, upper metal pillars 344 are arranged staggered with respect to lower metal pillars 354. For instance, metal pillars 344_3 and 344_4 are arranged staggered with respect to metal pillars 354_3 and 354_4. The layout of metal pillars 344 and 354 may be optimized to achieve desirable shielding performance based on the layout of antenna elements 120, RFICs 30, other ICs (if any) below base substrate 350, etc.

Figure 10:
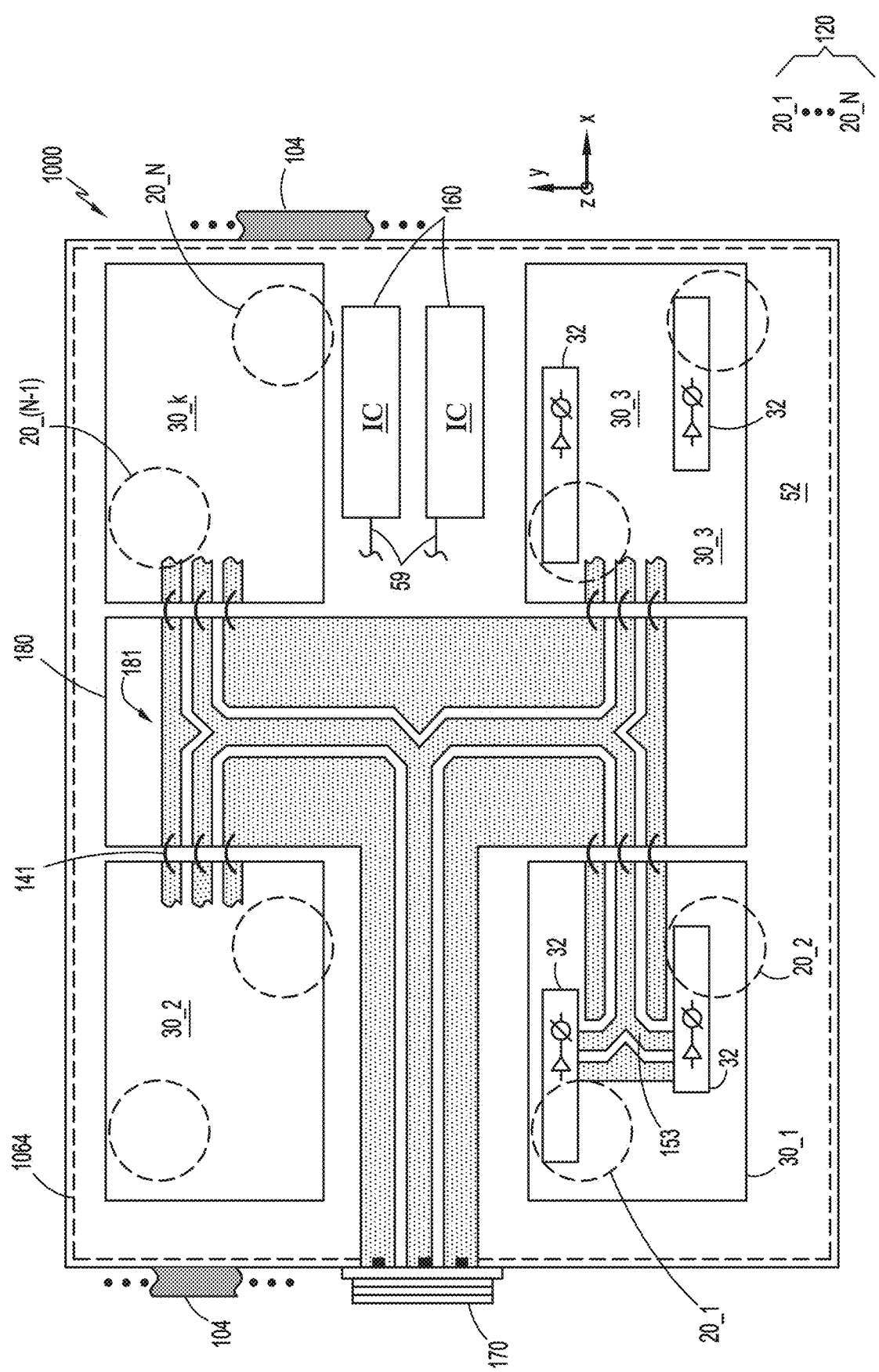
FIG. 10 is a plan view showing an example layout of a phased array antenna apparatus according to an embodiment.

FIG. 10 is a bottom view of an antenna apparatus 1000 depicting an example layout of antenna elements and RFICs of a phased array antenna apparatus according to an embodiment. The layout of antenna apparatus 1000 is an example layout for any one of antenna apparatus 100, 200, 300 and 300' embodied as a phased array. In the example, antenna apparatus 1000 includes a plurality N antenna elements 20_1 to 20_N that form an antenna array 120; a plurality K RFICs 30_1 to 30_K (K≤N); and a combiner/divider network 181 with sections interspersed between the RFICs 30. Combiner/divider network 181 may be formed within a substrate 180 such as alumina adhered to the lower surface of dielectric layer 52.

As seen in FIG. 10, in the x-y plane, radiation shield 1064 (e.g., radiation shield 64, 364 or 364') may have a profile approximately coextensive with that of antenna apparatus 100. Thereby, radiation shield 64 may shield all circuitry attached to or otherwise located below the surface of dielectric layer 52. Aside from RFICs 30, such circuitry may further include one or more control IC chips 160, which may be attached to dielectric layer 52 and provide control/bias signals to RFICs 30_1 to 30_K via signal lines 59. Control IC chips 160 may be composed of a different type of semiconductor material than RFICs 30. For instance, control IC chips 160 may be composed of silicon (Si) or silicon germanium (SiGe) whereas RFICs 30 may be composed of indium phosphide (InP), gallium arsenide (GaAs) or another type of III-V semiconductor material. Peripheral shielding 104 may surround dielectric layers 52 and 42 and provide additional protection from incident radiation.

In the shown example, each RFIC such as 30_1 is coupled to a plurality (N/K) of antenna elements, e.g., 20_1 and 20_2 through (N/K) RF circuits 32. An RFIC 30 may further include a (N/K):1 combiner/divider section 153 (e.g., a 2:1 combiner/divider) suitably coupled to combiner/divider 181. For instance, combiner/divider 181 may be formed with coplanar waveguide that is coupled to combiner/divider section 153 with wirebonds 141. In other examples, combiner/divider 181 or an alternative combiner/divider is formed in microstrip and/or is coupled to combiner/divider section 153 through vias and signal paths formed in another layer, e.g., a layer within dielectric layer 52 or a layer adjacent to the lower side of RFICs 30. In a transmitting antenna system, combiner/divider 181 may divide an input signal received by a connector 170 into K divided signals, each provided to one of RFICs 30 and further divided therein for adjustment (e.g., amplification and phase shifting) and transmission through antenna elements 120. Reciprocal combining operations may occur in a receiving antenna system.

Figure 11:
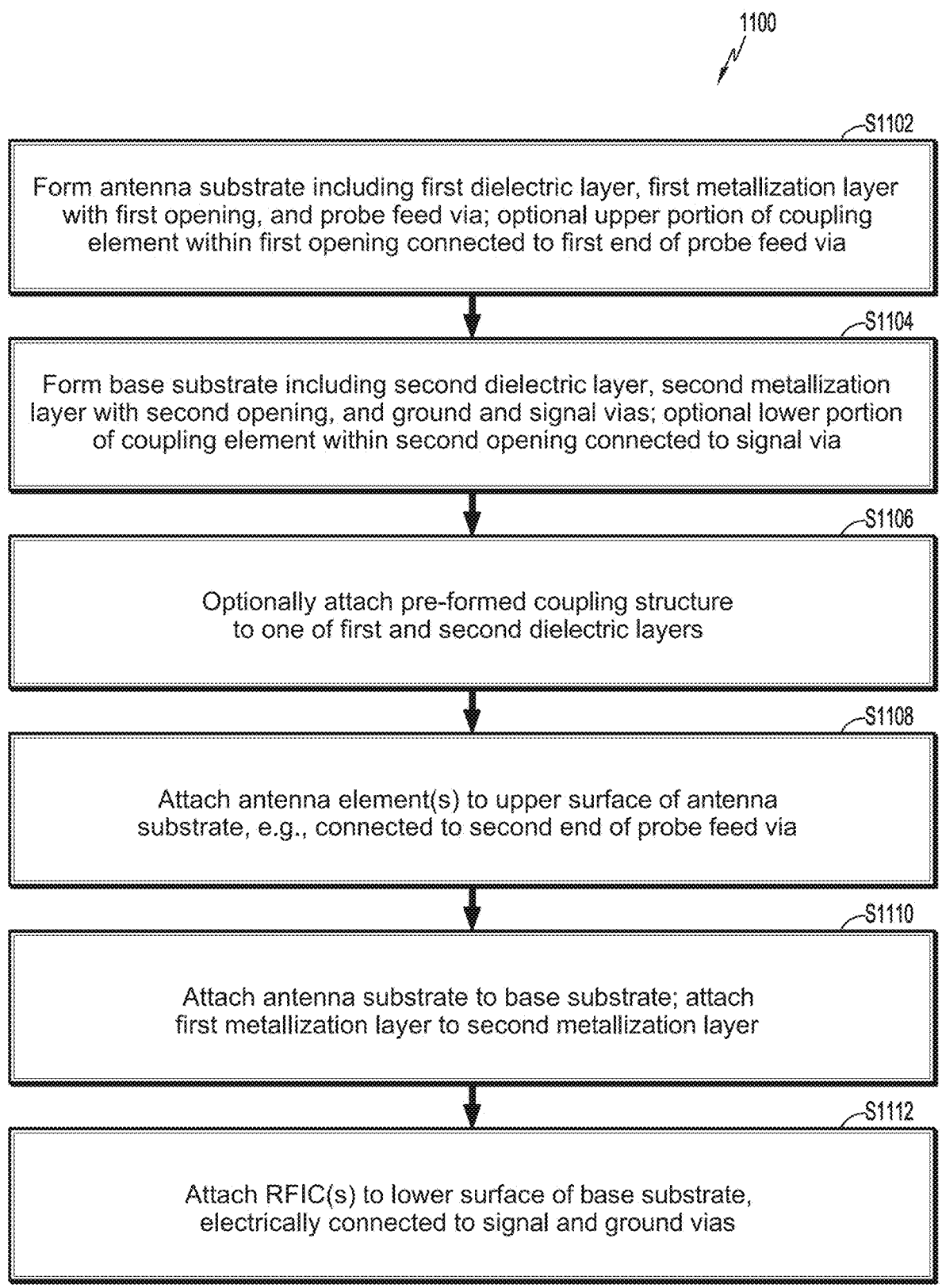
FIG. 11 is a flow diagram illustrating an example method of fabricating an antenna apparatus according to another embodiment.

FIG. 11 is a flow diagram illustrating an example method, 1100, of fabricating an antenna apparatus according to embodiment. Method 1100 may be utilized to manufacture any one of antenna apparatus 100, 200, 300 or 300'. The order of the operations illustrated in FIG. 11 is not critical and may be changed as desired.

With method 1100, an antenna substrate (e.g., 40/340) is formed (S1102). The antenna substrate may include a first dielectric layer (42), a first metallization layer (44/367) with a first opening (181a/381a), and a probe feed via (47) in the case of a direct connection to an antenna element. For the case of antenna apparatus 100, if coupling element 85 is to be formed with a metal pillar build-up process, upper metal pillar 44a may be formed layer by layer as part of the same process of forming first metallization layer 44. On the other hand, to produce antenna apparatus 300 or 300', first metallization layer 367 may be formed on the lower surface of dielectric layer 42 by thin film deposition or by initial metal build-up stages of a metal pillar build-up process. In the latter case, the initial metal build-up stages may also be initial stages to produce an upper metal pillar (44a) and an upper ring portion (44b) of a coaxial line section (80/380). In other examples, coupling element 85 is part of a pre-formed coaxial structure and an upper metal pillar portion and an upper ring portion may not be formed when antenna substrate 40/340 is formed.

A base substrate (50/50'/350) is formed (S1104), which includes a second dielectric layer (52, 52'); a second metallization layer (54/369) with a second opening (81b/381b) aligned with the first opening; a signal via (70) and at least one ground via (72a and/or 72b) within the dielectric layer. Analogous considerations as just described for the antenna substrate apply to the optional formation of lower metal pillar 54a and lower ring portion 54b in conjunction with forming the second metallization layer.

For embodiments in which the first and second metallization layers (and the coaxial coupling element layer portions, if applicable) are formed with a metal pillar build-up process, e.g., as described for antenna apparatus 100, process operations to form the first and second metallization layers may be as follows, with an example of copper: (i) form a copper seed layer at the surface of the respective dielectric layer (42/52); (ii) use photoresist to define peripheries of each of the metallization layers/pillars to be formed; (iii) electroplate copper over the copper seed layer; (iv) form a nickel diffusion barrier over the electroplated copper; and (v) form solder caps over the nickel diffusion barrier. For metal layers composed of an alternative metal, e.g., platinum or gold, the alternative metal may be substituted for copper in the above operations.

For embodiments utilizing a pre-formed coaxial coupling structure (380'''), one end of the coupling structure may be attached, e.g., soldered, to the first or second dielectric layers (S1106).

At least one antenna element (20) is attached to the upper surface of the antenna substrate and connected to the second end of the probe feed via (if included) (S1108). If the antenna element is a microstrip patch element, it may be formed on the antenna substate by a thin film metal deposition process.

The antenna substrate is attached to the base substrate and the first metallization layer is attached to the second metallization layer (S1110). In the case of antenna apparatus 100, the antenna and base substrates may be attached at the same time as the attachment of the first and second metallization layers through a conductive adherent layer (60), e.g., conductive epoxy or a solder cap layer, between the first and second metallization layers and also with a conductive adherent portion (60a) between the upper and lower metal pillars. In the case of antenna apparatus 300/300', the antenna and base substrates may be attached to one another prior to the attachment of the first and second metallization layers to one another, by attaching the upper and lower metal pillars (44a, 54a) to one another through the conductive adherent portion.

When a separate outer conductor 382 is to be formed, upper and lower portions (44b, 54b) may be attached to one another with a conductive adherent portion (60b) at the same time that the upper and lower metal pillar portions (44a, 54a) are attached. It is further noted that if a dielectric filled isolation region (381) is to be provided in the coaxial structure, dielectric may be grown on the first/second dielectric substrates, or placed within opening 381 prior to the attachment of the antenna and base substrates to one another.

In embodiments where a pre-formed coaxial structure (380''') is substituted for the metal pillar based construction, the antenna substrate and the base substrate may become attached (S1110) by attaching the unattached end of the coaxial structure to the other one of the base substrate and the antenna substrate. In either of these cases (whether the coaxial coupling structure is metal pillar based or a pre-formed structure), in the case of antenna apparatus 300 or 300', the metal pillar layer 365 may be formed after the attachment of the base substrate to the antenna substrate by inserting the fill material in a liquid form in the space surrounding the coaxial coupling structure, between the upper and lower metallization layers, and then heating the resulting structure to harden the fill material. When the fill material is hardened, this may also attach the first and second metallization layers to one another.

At least one RFIC (30) is attached to the lower surface of the base substrate, e.g., by electrically connecting signal and ground contacts (93s, 93g) to the signal and ground vias through respective solder caps (91) that are heated and cooled. The attachment may further involve attaching additional contacts to interconnects on the second dielectric layer for connecting signal lines (59) for carrying control/bias signals from the control IC(s).

While the technology described herein has been particularly shown and described with reference to example embodiments thereof, it will be understood by those of ordinary skill in the art that various changes in form and details may be made therein without departing from the scope of the claimed subject matter as defined by the following claims.

What is claimed is:

1. An antenna apparatus comprising:
   an antenna substrate including:
      a first dielectric layer having opposite first and second surfaces; and
      a first metallization layer adjacent the second surface to form a ground plane;
   at least one antenna element attached to the first surface;
   a base substrate including:
      at least one second dielectric layer having opposite third and fourth surfaces; and
      a second metallization layer having a first side adjacent the third surface and an opposite, second side attached to the first metallization layer to form at least part of a radiation shield, wherein the first and second metallization layers have respective first and second openings aligned with one another and underlying the at least one antenna element; and
   at least one radio frequency integrated circuit (RFIC) adjacent the fourth surface of the base substrate, RF coupled to the at least one antenna element through at least one via extending through the base substrate and a coupling element within the first and second openings,
   wherein the first and second metallization layers are attached and electrically connected to each other using an electrically conductive fill material layer between the first and second metallization layers.

2. The antenna apparatus of claim 1, wherein the electrically conductive fill material layer comprises is a material having a lower melting point than that of each of the first and second metallization layers.

3. The antenna apparatus of claim 1, wherein the electrically conductive fill material layer is a solder cap layer.

4. The antenna apparatus of claim 1, wherein the first metallization layer is a layer that was formed by a metal pillar build-up process.

5. The antenna apparatus of claim 4, wherein the second metallization layer is a layer that was formed by a metal pillar build-up process.

6. The antenna apparatus of claim 4, wherein the metal pillar build-up process is a copper pillar build-up process, a platinum pillar build-up process, or a gold pillar build-up process.

7. The antenna apparatus of claim 1, wherein the electrically conductive fill material layer comprises a thickness greater than a thickness of each of the first and second metallization layers.

8. The antenna apparatus of claim 7, wherein the electrically conductive fill material layer comprises conductive epoxy, a mixture of conductive epoxy and tantalum, underfill material, microwave absorber material, or any combination thereof.

9. The antenna apparatus of claim 8, wherein the electrically conductive fill material layer further comprises a plurality of metal pillars.

10. The antenna apparatus of claim 9, wherein at least some of the metal pillars are vertically aligned with other ones of the metal pillars.

11. The antenna apparatus of claim 1, wherein the coupling element includes a first metal pillar having one end attached to the via, a second metal pillar having one end attached to the second surface of the first dielectric layer, and a conductive adherent connecting a second end of the first metal pillar to a second end of the second metal pillar.

12. The antenna apparatus of claim 11, further comprising a probe feed via extending through the antenna substrate and having a first end connected to the antenna element and a second end forming a portion of the second surface of the antenna substrate and connected to the first end of the second metal pillar.

13. The antenna apparatus of claim 1, wherein each of the first metallization layer and the second metallization layer is at least 50 µm thick.

14. The antenna apparatus of claim 1, wherein each of the first metallization layer and the second metallization layer is at least 100 µm thick.

15. The antenna apparatus of claim 1, wherein each of the at least one antenna element is a microstrip patch antenna element with a thickness in the range of 1-5 µm.

16. The antenna apparatus of claim 1, further comprising radiation shielding extending peripherally around the antenna substrate and the base substrate.

17. The antenna apparatus of claim 16, wherein the radiation shielding is a portion of a metal housing.

18. The antenna apparatus of claim 1, wherein the at least one RFIC is in the form of an RFIC chip or an RFIC wafer.

19. The antenna apparatus of claim 1, further comprising at least one further IC, attached to the fourth surface of the base substrate and configured to output control signals to the at least one RFIC.

20. The antenna apparatus of claim 1, wherein:
the at least one antenna element is a plurality of antenna elements forming an antenna array;
the at least one RFIC is a plurality of RFICs, each attached to the fourth surface of the second dielectric layer; and
the plurality of RFICs are RF coupled to the plurality of antenna elements through respective RF feeds each including one of a plurality of vias within the base substrate and one of a plurality of antenna feeds formed within the antenna substrate.

21. The antenna apparatus of claim 20, wherein the at least one second dielectric layer of the base substrate comprises a first dielectric sub-layer adjacent the second metallization layer and a second dielectric sub-layer adjacent the RFICs, and the base substrate further comprising a patterned conductive layer, between the first and second dielectric sub-layers, configured to route RF signals to/from the RFICs.

22. The antenna apparatus of claim 20, wherein each of the RF feeds includes a ground-signal, GS, connection or a ground-signal-ground, GSG, connection comprising:
one of the vias forming a signal via between a signal contact of an RFIC of the RFICs to a metal pillar at the third surface within the second opening; and
at least one ground via, spaced from the signal via, extending between the third surface and at least one ground contact of the RFIC.

23. The antenna apparatus of claim 1, wherein the coupling element forms an inner conductor of a coaxial transmission line section.

24. The antenna apparatus of claim 23, wherein the coaxial transmission line section includes an isolation region filled with dielectric material.

25. The antenna apparatus of claim 23, wherein the coaxial transmission line section includes an outer conductor having upper and lower portions each formed by a metal pillar formation process, the upper and lower portions being connected by an electrically conductive adherent.

26. The antenna apparatus of claim 23, wherein the coaxial transmission line section includes an outer conductor split into a plurality of conductive wall sections.

27. The antenna apparatus of claim 1, wherein the coupling element is disposed between a plurality of ground rods.

28. The antenna apparatus of claim 27, wherein the plurality of ground rods comprise at least three circumferentially arranged ground rods surrounding the coupling element.

29. The antenna apparatus of claim 23, wherein the coaxial transmission line section includes an inner conductor composed entirely of a single metal material and an outer conductor composed entirely of a single metal material.

30. A method of forming an antenna apparatus, comprising:
forming an antenna substrate comprising a first dielectric layer having opposite first and second surfaces, and a first metallization layer adjacent the second surface to form a ground plane for at least one antenna element, the first metallization layer being formed with a first opening;
attaching the at least one antenna element to the first surface of the antenna substrate;
forming a base substrate comprising: at least one second dielectric layer having opposite third and fourth surfaces; at least one via extending through the second dielectric layer, and a second metallization layer adjacent the third surface to form at least part of a radiation shield in conjunction with the first metallization layer, the second metallization layer having a second opening aligned with the first opening; and at least one signal via having a first end within the second opening and extending through the second dielectric layer;
attaching the antenna substrate to the base substrate by at least connecting a coupling element within the first and second openings between the signal via and the antenna substrate, and attaching the first metallization layer to the second metallization layer; and
attaching at least one radio frequency integrated circuit (RFIC) to the fourth surface of the base substrate, electrically connected to the at least one signal via,
wherein said attaching the first metallization layer to the second metallization layer is performed by adhering the first metallization layer to the second metallization layer with a conductive adherent fill material layer.

31. The method of claim 30, wherein the first metallization layer, the second metallization layer, and a layer therebetween formed by the conductive adherent forms a radiation shield with respect to the at least one RFIC.

32. The method of claim 31, wherein the electrically conductive adherent is a solder cap.

33. The method of claim 30, further comprising forming each of the first and second metallization layers by a metal pillar build-up process.

34. The method of claim 33, wherein the metal pillar build-up process comprises:
forming a copper seed layer at a surface of the first or second dielectric layers;
using photoresist to define peripheries of copper pillars and the first or second metallization layers;
electroplating copper over the copper seed layer;
forming a nickel diffusion barrier over the electroplated copper; and
forming solder caps over the nickel diffusion barrier.

35. The method of claim 30, wherein each of the first and second metallization layers is formed at a thickness of at least 50 µm with a copper build-up process.

36. The method of claim 30, wherein the first and second metallization layers are attached to one another with the conductive adherent fill material layer after the antenna substrate is attached to the base substrate, by inserting a liquid fill material in a region between the first and second metallization layers and hardening the fill material.

* * * * *